United States Patent
Wenner

[19]

[11] Patent Number: 6,157,023
[45] Date of Patent: Dec. 5, 2000

[54] GARAGE DOOR ELECTRIC EYE PROTECTIVE COVER

[76] Inventor: Thomas T. Wenner, 3456 County Rd. 8 Southeast, Saint Cloud, Minn. 56304

[21] Appl. No.: 09/282,933

[22] Filed: Apr. 1, 1999

[51] Int. Cl.[7] ....................................... H01J 40/14

[52] U.S. Cl. ........................ 250/221; 250/239; 340/555; 340/556; D13/165

[58] Field of Search ................................ 250/222.1, 221, 250/239, 342; 340/555, 556, 557; D13/165, 137.3; 49/26; D10/104, 106

[56] References Cited

U.S. PATENT DOCUMENTS 5,739,753  4/1998  Porter ........................................ 340/555

Primary Examiner—F. L. Evans

[57] ABSTRACT

A garage door electric eye protective cover for covering a low lying electric eye of a garage door opener assembly so that the electric eye does not become misaligned from accidental bumping into the electric eye. The garage door electric eye protective cover includes a housing with an upper opening and an open back. A lens cover substantially covers the upper opening. The housing also has an outwardly extending mounting flange therearound adjacent the open back of the housing.

17 Claims, 2 Drawing Sheets

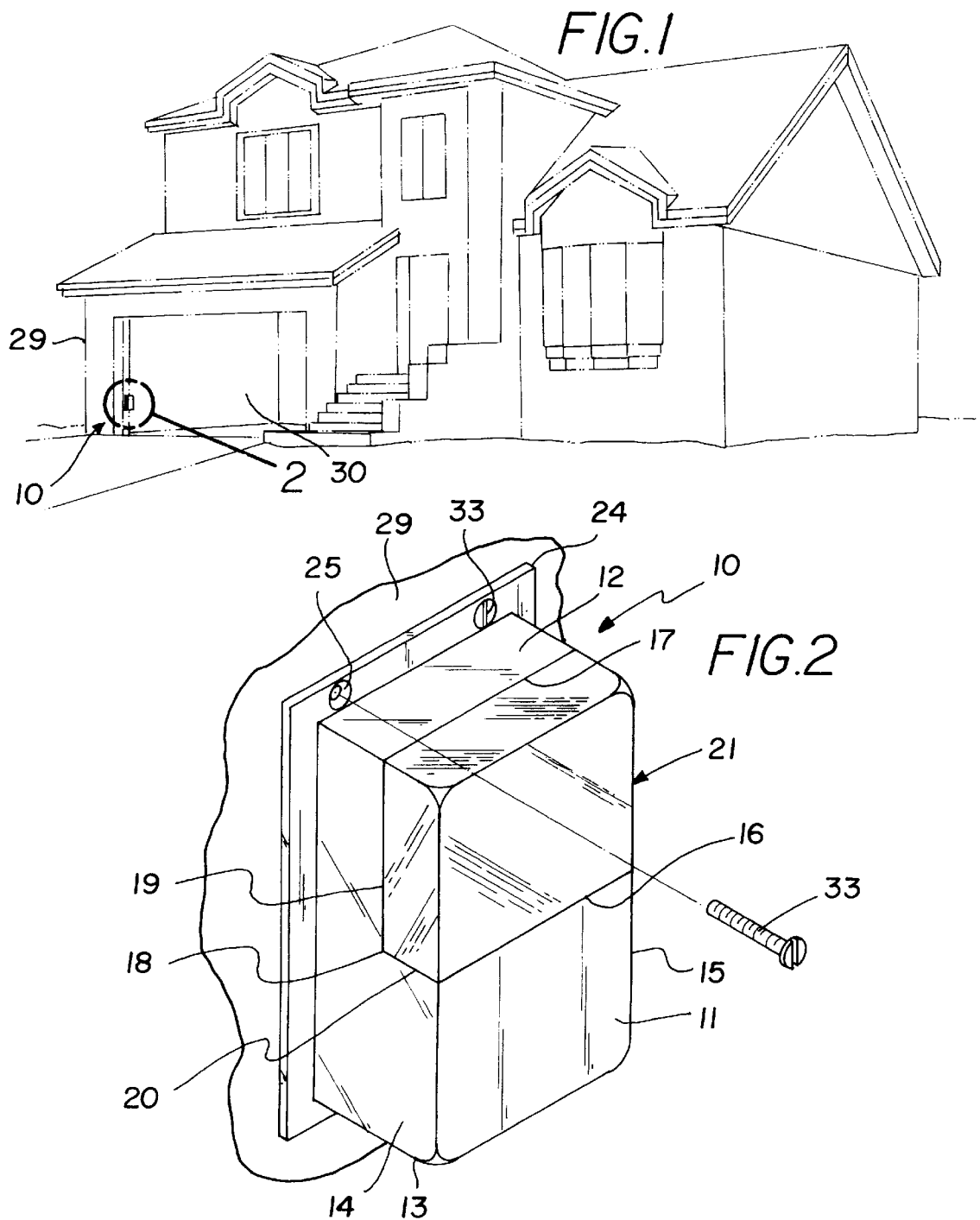

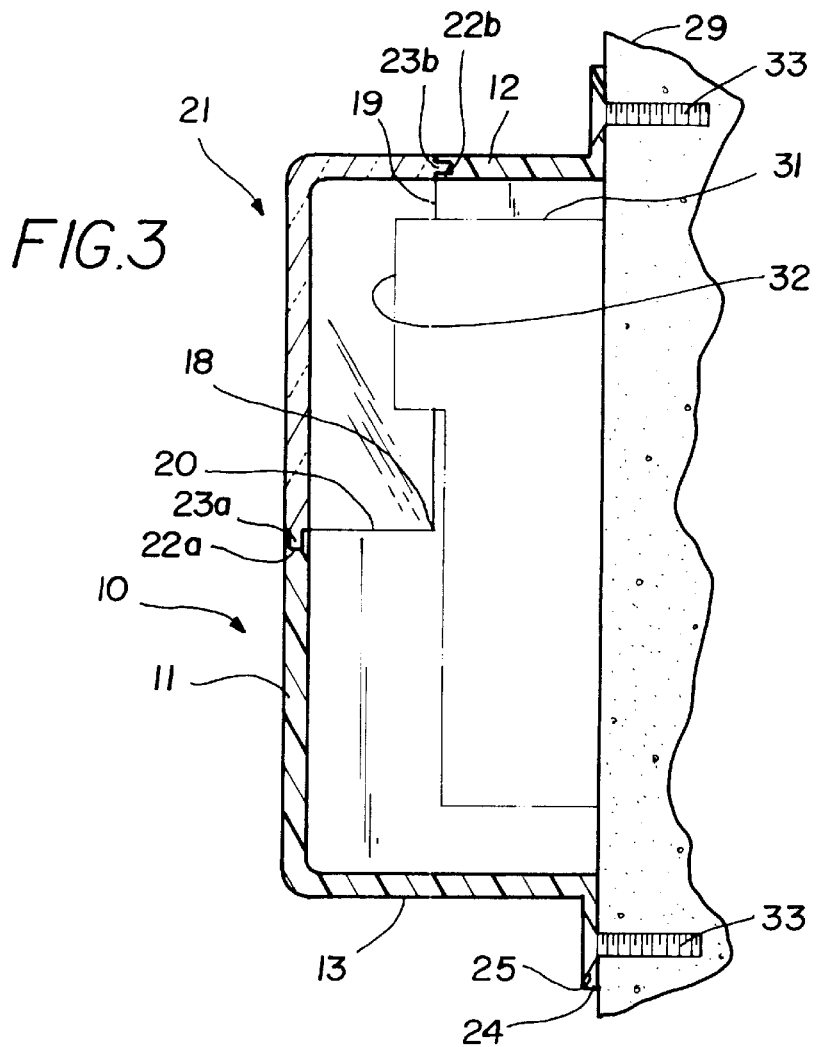
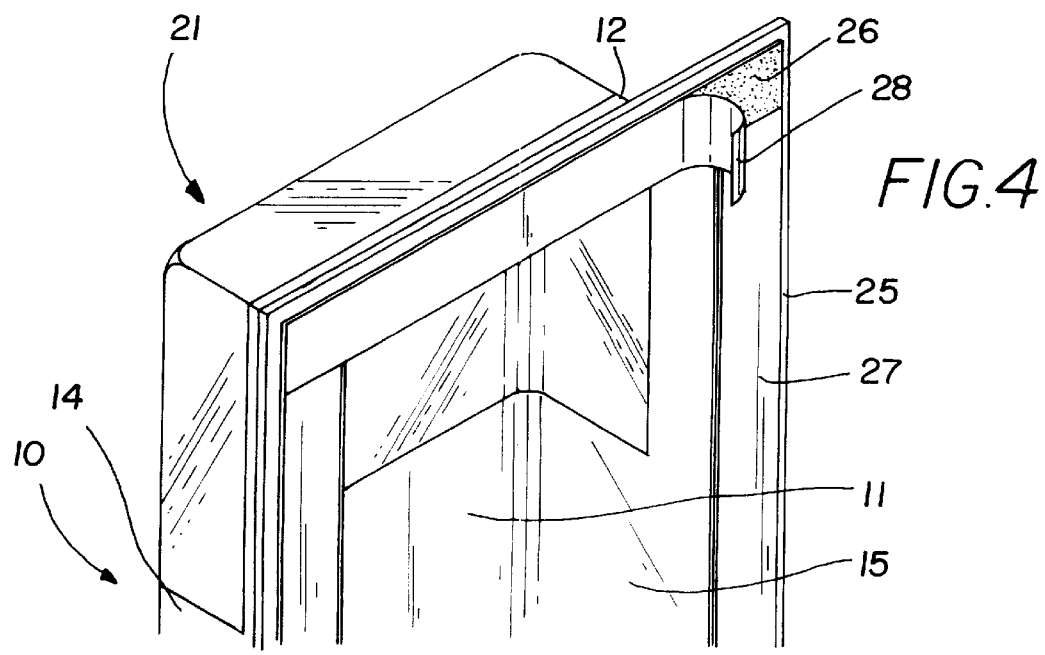

GARAGE DOOR ELECTRIC EYE PROTECTIVE COVER

BACKGROUND OF THE INVENTION

1. Field of the Invention

The present invention relates to protective covers for electric eye transmitters and receivers and more particularly pertains to a new garage door electric eye protective cover for covering a low lying electric eye of a garage door opener assembly so that the electric eye does not become misaligned from accidental bumping into the electric eye.

2. Description of the Prior Art

The use of protective covers for electric eye transmitters and receivers is known in the prior art. More specifically, protective covers for electric eye transmitters and receivers heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. No. Des. 297,717 by Chu; U.S. Pat. No. Des. 320,758 by Lutz et al.; U.S. Pat. No. 4,240,735 by Maitani et al.; U.S. Pat. No. 2,738,585 by Vissing; U.S. Pat. No. 5,716,127 by Menke et al.; and U.S. Pat. No. 4,320,949 by Pagano.

While these devices fulfill their respective, particular objectives and requirements, the aforementioned patents do not disclose a new garage door electric eye protective cover. The inventive device includes a housing with an upper opening and an open back. A lens cover substantially covers the upper opening. The housing also has an outwardly extending mounting flange therearound adjacent the open back of the housing.

In these respects, the garage door electric eye protective cover according to the present invention substantially departs from the conventional concepts and designs of the prior art, and in so doing provides an apparatus primarily developed for the purpose of covering a low lying electric eye of a garage door opener assembly so that the electric eye does not become misaligned from accidental bumping into the electric eye.

SUMMARY OF THE INVENTION

In view of the foregoing disadvantages inherent in the known types of protective covers for electric eye transmitters and receivers now present in the prior art, the present invention provides a new garage door electric eye protective cover construction wherein the same can be utilized for covering a low lying electric eye of a garage door opener assembly so that the electric eye does not become misaligned from accidental bumping into the electric eye.

The general purpose of the present invention, which will be described subsequently in greater detail, is to provide a new garage door electric eye protective cover apparatus and method which has many of the advantages of the protective covers for electric eye transmitters and receivers mentioned heretofore and many novel features that result in a new garage door electric eye protective cover which is not anticipated, rendered obvious, suggested, or even implied by any of the prior art protective covers for electric eye transmitters and receivers, either alone or in any combination thereof.

To attain this, the present invention generally comprises a housing with an upper opening and an open back. A lens cover substantially covers the upper opening. The housing also has an outwardly extending mounting flange therearound adjacent the open back of the housing.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new garage door electric eye protective cover apparatus and method which has many of the advantages of the protective covers for electric eye transmitters and receivers mentioned heretofore and many novel features that result in a new garage door electric eye protective cover which is not anticipated, rendered obvious, suggested, or even implied by any of the prior art protective covers for electric eye transmitters and receivers, either alone or in any combination thereof.

It is another object of the present invention to provide a new garage door electric eye protective cover which may be easily and efficiently manufactured and marketed.

It is a further object of the present invention to provide a new garage door electric eye protective cover which is of a durable and reliable construction.

An even further object of the present invention is to provide a new garage door electric eye protective cover which is susceptible of a low cost of manufacture with regard to both materials and labor, and which accordingly is then susceptible of low prices of sale to the consuming public, thereby making such garage door electric eye protective cover economically available to the buying public.

Still yet another object of the present invention is to provide a new garage door electric eye protective cover which provides in the apparatuses and methods of the prior art some of the advantages thereof, while simultaneously overcoming some of the disadvantages normally associated therewith.

Still another object of the present invention is to provide a new garage door electric eye protective cover for covering a low lying electric eye of a garage door opener assembly so that the electric eye does not become misaligned from accidental bumping into the electric eye.

Yet another object of the present invention is to provide a new garage door electric eye protective cover which includes a housing with an upper opening and an open back. A lens cover substantially covers the upper opening. The housing also has an outwardly extending mounting flange therearound adjacent the open back of the housing.

Still yet another object of the present invention is to provide a new garage door electric eye protective cover that encloses an electric eye of a garage door opening assembly so that the electric eye is protected from contact with outside objects and is also protected from the weather.

Even still another object of the present invention is to provide a new garage door electric eye protective cover that easily mounts to a vertical structure such as a side of a garage assembly adjacent the garage door.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a schematic perspective view of a new garage door electric eye protective cover in use according to the present invention.

FIG. 2 is a schematic enlarged perspective view of the present invention taken from the circle 2 on FIG. 1.

FIG. 3 is a schematic cross sectional view of the present invention.

FIG. 4 is a schematic partial back perspective view of the adhesive strip embodiment of the present invention.

DESCRIPTION OF THE PREFERRED EMBODIMENT

With reference now to the drawings, and in particular to FIGS. 1 through 4 thereof, a new garage door electric eye protective cover embodying the principles and concepts of the present invention will be described.

As best illustrated in FIGS. 1 through 4, the garage door electric eye protective cover generally comprises a housing with an upper opening and an open back. A lens cover substantially covers the upper opening. The housing also has an outwardly extending mounting flange therearound adjacent the open back of the housing.

In closer detail, the protective cover comprises a generally rectangular box-shaped housing 10 having a generally rectangular front panel 11, generally rectangular top and bottom panels 12,13, a pair of generally rectangular side panels 14,15, and an open back. Preferably, the housing comprises a resilient material such as a resilient plastic material that is also preferably resistant to weathering. In the preferred embodiment, the top and bottom panels of the housing are substantially parallel to one another and substantially perpendicular to the front panel of the housing. Also preferably, the side panels of the housing are substantially parallel to one another and substantially perpendicular to the top and bottom panels of the housing and substantially perpendicular to the front panel of the housing. In an ideal illustrative embodiment, the housing has a height defined between the top and bottom panels of about 8 ¼ inches, a depth defined between the front panel and the open back of about 4 ½ inches and a width defined between the side panels of about 4 ½ inches.

The housing has an upper opening therein with portions of the upper opening located in the front, top, and side panels of the housing so that the upper opening of the housing has an outer periphery extending into the front, top, and side panels of the housing. The front and top panels of the housing each have substantially straight portions 16,17 of the outer periphery of the upper opening. Preferably, these straight portions of the outer periphery are extended substantially parallel to one another.

Each of the side panels of the housing each has a generally L-shaped portion 18 of the outer periphery of the upper opening. The L-shaped portions of the outer periphery of the upper opening connect the straight portions of the outer periphery of the upper opening. Each of the L-shaped portions of the outer periphery of the upper opening ideally has a long region 19 and a short region 20. The short regions of the outer periphery of the upper opening preferably lie in a common plane with the straight portion of the outer periphery of the upper opening located in the front panel of the housing. In this ideal embodiment, the long regions each are preferably extended substantially perpendicular to the common plane.

A lens cover 21 substantially covers the upper opening of the housing. The lens cover comprises a translucent (ideally transparent) material to permit passage of light and other radiation waves therethrough. The lens cover has an outer perimeter substantially coextensive with the outer periphery of the upper open. The outer perimeter of the lens cover abutting the front, top, and side panels of the housing along the outer periphery of the upper opening.

As illustrated in FIG. 3, the housing has a plurality of spaced apart slots 22a,22b therein along the outer periphery of the upper opening. Correspondingly, the lens cover has a plurality of spaced apart tabs 23a,23b outwardly extending from the outer perimeter of the lens cover. Each of the tabs is inserted into an adjacent corresponding slot of the housing to couple the lens cover to the housing.

The housing has an outwardly extending mounting flange 24 along the top, bottom, and side panels of the housing adjacent the open back of the housing. The mounting flange and the front panel preferably lie in substantially parallel planes with one another. In one preferred embodiment, the mounting flange has a plurality of spaced apart mounting holes 25 therethrough each designed for extending a fastener therethrough. Ideally, the plurality of mounting holes includes an upper pair of mounting holes positioned on the mounting flange adjacent the top panel of the housing and a lower pair of mounting holes positioned on the mounting flange adjacent the bottom panel of the housing.

With reference to FIG. 4, in another preferred embodiment, the mounting flange has at least one adhesive strip 26 on a back face 27 of the mounting flange for permitting adhesive coupling of the mounting flange to a structure with the adhesive strip. The adhesive strip ideally has a substantially coextensive protective backing 28 thereon covering the adhesive strip. The protective backing comprises a flexible sheet material that is easily peelable off of the adhesive strip without removing too much adhesive from the adhesive strip when the protective sheet is peeled away. Ideally, at least one of the adhesive strips is positioned on the back face of the mounting flange adjacent the top panel of the housing and another adhesive strip is positioned on the back face of the mounting flange adjacent the bottom panel of the housing.

In use, the cover is designed for use on a garage structure 29 with a garage door opening and a garage door 30 closing the garage door opening. A garage door opener assembly is provided for remote controlled opening and closing the garage door. The garage door opener assembly has an electric eye assembly 31 for selectively controlling opening and closing of the garage door by the garage door opener assembly. The electric eye assembly is mounted to the garage structure proximal a ground surface. The electric eye assembly has a detector 32 or electric eye comprises a transmitter and receiver for detecting an object moving in a predetermined zone of detection.

As illustrated in FIG. 3, the housing receives the electric eye assembly therein through the open back of the housing such that the mounting flange of the housing abuts the garage structure to substantially enclose the electric eye assembly in the housing. The detector is positioned adjacent the window to permit detection of an object moving in the predetermined zone of detection through the window. The mounting flange is mounted to the garage structure to secure the housing to the garage structure. In the mounting hole embodiment, fasteners 33 are extended through the mounting holes into the garage structure to mount the mounting flange to the garage structure. In the adhesive strip embodiment, the adhesive strip adhesively couples the mounting flange to the garage structure.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A protective cover for an electric eye assembly, comprising:

a housing having a front panel, top and bottom panels, a pair of side panels, and an open back for receiving an electric eye assembly therein;

said housing having an upper opening therein;

a lens cover substantially covering said upper opening of said housing;

said housing having an outwardly extending mounting flange along said top, bottom, and side panels of said housing adjacent said open back of said housing; and wherein said upper opening has portions located in said front, top, and side panels of said housing so that said upper opening of said housing has an outer periphery extending into said front, top, and side panels of said housing.

2. The protective cover of claim 1, wherein said top and bottom panels of said housing are substantially parallel to one another and substantially perpendicular to said front panel of said housing, and wherein said side panels of said housing are substantially parallel to one another and substantially perpendicular to said top and bottom panels of said housing and substantially perpendicular to said front panel of said housing.

3. The protective cover of claim 1, wherein said front and top panels of said housing each have substantially straight portions of said outer periphery of said upper opening, wherein said straight portions of said outer periphery are extended substantially parallel to one another, wherein each of said side panels of said housing have a generally L-shaped portion of said outer periphery of said upper opening, wherein said L-shaped portions of said outer periphery of said upper opening connect said straight portions of said outer periphery of said upper opening.

4. The protective cover of claim 3, wherein each of said L-shaped portions of said outer periphery of said upper opening has a long region and a short region, wherein said short regions of said outer periphery of said upper opening lie in a common plane with said straight portion of said outer periphery of said upper opening located in said front panel of said housing, and wherein said long regions each are extended substantially perpendicular to said common plane.

5. The protective cover of claim 1, wherein said lens cover has an outer perimeter substantially coextensive with said outer periphery of said upper open, said outer perimeter of said lens cover abutting said front, top, and side panels of said housing along said outer periphery of said upper opening.

6. The protective cover of claim 5, wherein said housing has a plurality of spaced apart slots therein-along said outer periphery of said upper opening, wherein said lens cover has a plurality of spaced apart tabs outwardly extending from said outer perimeter of said lens cover, and wherein each of said tabs is inserted into an adjacent corresponding slot of said housing to couple said lens cover to said housing.

7. The protective cover of claim 1, wherein said mounting flange has a plurality of spaced apart mounting holes therethrough.

8. The protective cover of claim 7, wherein said plurality of mounting holes includes an upper pair of mounting holes positioned on said mounting flange adjacent said top panel of said housing, and a lower pair of mounting holes positioned on said mounting flange adjacent said bottom panel of said housing.

9. An electric eye assembly protective cover, comprising:

a generally rectangular box-shaped housing having a generally rectangular front panel, generally rectangular top and bottom panels, a pair of generally rectangular side panels, and an open back;

said top and bottom panels of said housing being substantially parallel to one another and substantially perpendicular to said front panel of said housing;

said side panels of said housing being substantially parallel to one another and substantially perpendicular to said top and bottom panels of said housing and substantially perpendicular to said front panel of said housing;

said housing having an upper opening therein, said upper opening having portions located in said front, top, and side panels of said housing so that said upper opening of said housing has an outer periphery extending into said front, top, and side panels of said housing;

said front and top panels of said housing each having substantially straight portions of said outer periphery of said upper opening, said straight portions of said outer periphery being extended substantially parallel to one another;

each of said side panels of said housing each having a generally L-shaped portion of said outer periphery of said upper opening, said L-shaped portions of said outer periphery of said upper opening connecting said straight portions of said outer periphery of said upper opening;

each of said L-shaped portions of said outer periphery of said upper opening having a long region and a short region, said short regions of said outer periphery of said upper opening lying in a common plane with said straight portion of said outer periphery of said upper opening located in said front panel of said housing, said long regions each being extended substantially perpendicular to said common plane;

a lens cover substantially covering said upper opening of said housing, said lens cover comprising a translucent material;

said lens cover having an outer perimeter substantially coextensive with said outer periphery of said upper open, said outer perimeter of said lens cover abutting said front, top, and side panels of said housing along said outer periphery of said upper opening;

said housing having a plurality of spaced apart slots therein along said outer periphery of said upper opening;

said lens cover having a plurality of spaced apart tabs outwardly extending from said outer perimeter of said lens cover, each of said tabs being inserted into an adjacent corresponding slot of said housing to couple said lens cover to said housing;

said housing having an outwardly extending mounting flange along said top, bottom, and side panels of said housing adjacent said open back of said housing;

said mounting flange and said front panel lying in substantially parallel planes with one another;

said mounting flange having a plurality of spaced apart mounting holes therethrough;

said plurality of mounting holes including an upper pair of mounting holes positioned on said mounting flange adjacent said top panel of said housing;

said plurality of mounting holes including a lower pair of mounting holes positioned on said mounting flange adjacent said bottom panel of said housing;

said housing being adapted for receiving an electric eye assembly therein through said open back of said housing such that said mounting flange of said housing is adapted for abutting a garage structure to substantially enclose the electric eye assembly in said housing;

said window being adapted for permitting detection by a detector of the electric eye assembly of an object moving in a predetermined zone of detection through said window; and said mounting flange being being adapted for mounting to the garage structure, wherein fasteners are extended through said mounting holes into the garage structure to mount said mounting flange to the garage structure.

10. A protective cover for an electric eye assembly, comprising:

a housing having a front panel, top and bottom panels, a pair of side panels, and an open back for receiving an electric eye assembly therein;

said housing having an upper opening therein;

a lens cover substantially covering said upper opening of said housing; and wherein said upper opening has portions located in said front, top, and side panels of said housing so that said upper opening of said housing has an outer periphery extending into said front, top, and side panels of said housing.

11. The protective cover of claim 10, wherein said top and bottom panels of said housing are substantially parallel to one another and substantially perpendicular to said front panel of said housing, and wherein said side panels of said housing are substantially parallel to one another and substantially perpendicular to said top and bottom panels of said housing and substantially perpendicular to said front panel of said housing.

12. The protective cover of claim 10, wherein said front and top panels of said housing each have substantially straight portions of said outer periphery of said upper opening, wherein said straight portions of said outer periphery are extended substantially parallel to one another, wherein each of said side panels of said housing have a generally L-shaped portion of said outer periphery of said upper opening, wherein said L-shaped portions of said outer periphery of said upper opening connect said straight portions of said outer periphery of said upper opening.

13. The protective cover of claim 12, wherein each of said L-shaped portions of said outer periphery of said upper opening has a long region and a short region, wherein said short regions of said outer periphery of said upper opening lie in a common plane with said straight portion of said outer periphery of said upper opening located in said front panel of said housing, and wherein said long regions each are extended substantially perpendicular to said common plane.

14. The protective cover of claim 10, wherein said lens cover has an outer perimeter substantially coextensive with said outer periphery of said upper open, said outer perimeter of said lens cover abutting said front, top, and side panels of said housing along said outer periphery of said upper opening.

15. The protective cover of claim 14, wherein said housing has a plurality of spaced apart slots therein along said outer periphery of said upper opening, wherein said lens cover has a plurality of spaced apart tabs outwardly extending from said outer perimeter of said lens cover, and wherein each of said tabs is inserted into an adjacent corresponding slot of said housing to couple said lens cover to said housing.

16. The protective cover of claim 10, wherein said housing has a mounting flange with a plurality of spaced apart mounting holes therethrough.

17. The protective cover of claim 16, wherein said plurality of mounting holes includes an upper pair of mounting holes positioned on said mounting flange adjacent said top panel of said housing, and a lower pair of mounting holes positioned on said mounting flange adjacent said bottom panel of said housing.

* * * * *